United States Patent
Mott et al.

(10) Patent No.: US 6,738,915 B1
(45) Date of Patent: May 18, 2004

(54) SYSTEM FOR SUPPLYING MULTIPLE VOLTAGES TO DEVICES ON CIRCUIT BOARD THROUGH A SEQUENCING IN A PREDICTABLE SEQUENCE

(75) Inventors: James A. Mott, Oakland, CA (US); William M. Baldwin, San Jose, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/569,535

(22) Filed: May 12, 2000

(51) Int. Cl.[7] .................................................. G06F 1/26
(52) U.S. Cl. ................................................... 713/330
(58) Field of Search ........................... 710/302; 713/300, 713/330, 340; 361/1, 9, 58, 111, 788

(56) References Cited

U.S. PATENT DOCUMENTS

| | | | | |
|---|---|---|---|---|
| 4,151,425 A | * | 4/1979 | Cappa ........................ 307/130 |
| 4,593,349 A | * | 6/1986 | Chase et al. ................ 713/330 |
| 5,077,675 A | * | 12/1991 | Tam ............................. 361/19 |
| 5,636,347 A | * | 6/1997 | Muchnick et al. .......... 710/302 |
| 5,987,549 A | * | 11/1999 | Hagersten et al. .......... 710/107 |
| 6,138,195 A | * | 10/2000 | Bermingham et al. ...... 710/104 |
| 6,308,278 B1 | * | 10/2001 | Khouli et al. ............... 713/323 |
| 6,457,131 B2 | * | 9/2002 | Kuemerle ................... 713/300 |

FOREIGN PATENT DOCUMENTS

JP           03136349 A   *   6/1991   ........... H01L/21/82

OTHER PUBLICATIONS

IMB TDB—"Power Sequencing Circuit for Multi–Processor Based Computer System"—Research Disclosure, Jul. 1999. UK—Ju 1, 1999—vol. 42—Issue 423.*

* cited by examiner

Primary Examiner—Thomas Lee
Assistant Examiner—Thuan Du
(74) Attorney, Agent, or Firm—O'Melveny & Myers LLP

(57) ABSTRACT

An apparatus and method for enabling hot swapped circuit boards to receive multiple power voltages from a backplane and supply the multiple power voltages to devices on the circuit board in a predictable sequence. An apparatus according to the invention would include a circuit board having an electrical connector, a sequencing circuit, and an element. The electrical connector of the circuit board receives the multiple power voltages from another circuit board, such as a backplane or motherboard. The sequencing circuit receives the multiple power voltages from the electrical connector. When a part of the sequencing circuit receives a signal indicating that the sequencing circuit has received a first power voltage, the sequencing circuit provides a second power voltage to the element electrically coupled to the sequencing circuit.

27 Claims, 3 Drawing Sheets

SYSTEM FOR SUPPLYING MULTIPLE VOLTAGES TO DEVICES ON CIRCUIT BOARD THROUGH A SEQUENCING IN A PREDICTABLE SEQUENCE

FIELD

This invention relates generally to power sequencing for a circuit board, and in particular an apparatus and method for enabling hot swapped circuit boards to receive multiple power voltages from a backplane or a midplane and supply the multiple power voltages to devices on the circuit board in a predictable sequence.

BACKGROUND

Computer manufacturers are adopting standards, such as the Compact PCI Specification and the InfiniBand Technology Specification requiring a backplane to provide not just one voltage but multiple voltages to a peripheral card inserted into the midplane or backplane during active operation of a system. Providing multiple voltages from the backplane tends to increase the amount of power practically available to the peripheral card, because power is then no longer unnecessarily dissipated by converting from a voltage provided by the midplane or backplane to a voltage not provided by the midplane or backplane but required by the peripheral card, or circuit board.

However, providing multiple voltages from the backplane to the peripheral card can be problematic. Initially, the peripheral card may be inserted at a skewed angle into the backplane.

Such skew may prevent contacts on the peripheral card from connecting to the backplane in a predictable order. Mechanical skew may thus result in the multiple voltages provided by the backplane being supplied to the peripheral card in random sequences varying over several insertions of the peripheral card.

Devices such as the Intel 21554 and Intel 21555 (but also including virtually all integrated circuits available commercially) have been designed to require that they be powered up by certain voltages in a predictable sequence. If such devices receive those voltages out of order, the devices may behave unpredictably, or even be destroyed. A peripheral card including such devices must ensure that the multiple voltages provided from the backplane are supplied to the devices on the peripheral card in the required, predictable sequence. Thus, a solution to the power sequencing problem demands that the multiple voltages provided by the backplane be supplied to the peripheral card in a predictable sequence.

Moreover, providing multiple voltages from the backplane to the peripheral card involves other concerns. During operation, many devices require a certain voltage difference between the multiple voltages supplied to the devices. Further, one of the provided multiple voltages may be interrupted. While a board is being removed from a backplane or motherboard, voltages may be removed from the board out of sequence with respect to the requirements of an integrated circuit powered by the voltages. For example, the peripheral card might be physically removed from the backplane. In addition, contact bounce, or intermittent electrical connection between the backplane and the peripheral card, may occur during insertion or removal of the card. The resulting sudden swing from an expected power voltage to zero volts may harm the peripheral card. A power sequencing solution addressing the voltage difference and interrupted voltage concerns may help ensure reliable operation of devices on the peripheral card.

Another concern in the insertion or removal of the card is current limiting, to prevent large inrush currents as the peripheral card's decoupling capacitance is charged, as the inrush currents may disrupt voltages supplied to other devices plugged into the midplane or backplane. Real estate on a peripheral card can be quite limited. The size or quantities of resistors needed to provide current limiting is frequently prohibitive. A power sequencing solution might also address the problem of inrush currents in a compact format.

SUMMARY

To overcome the limitations described above, and to overcome other limitations that will become apparent upon reading and understanding the present specification, the present invention discloses a circuit board for use in systems that provide multiple power voltages to circuit boards. It is one object of the invention to provide a circuit board having circuitry with the property of receiving multiple power voltages generated externally from the circuit board and providing the multiple power voltages in a predictable sequence to a part of the circuit board. It is a further object of the invention to provide a highly compact power sequencing solution which also implements current limiting, and has minimal space and cost impact on the circuit board. It is another object of the invention to prevent damage to the circuit board in the event that the supply of multiple power voltages to the circuit board should be interrupted.

In accordance with these objects, the present invention is a circuit board comprising an electrical connector, a sequencing circuit, and an element. An element is an electronic device that receives one or more voltages in a predictable sequence, either at start up or during operation. Multiple power voltages are generated externally from the circuit board. The electrical connector of the circuit board receives the multiple power voltages from a second circuit board, such as a backplane or a motherboard. The sequencing circuit receives the multiple power voltages from the electrical connector. When a part of the sequencing circuit receives a signal indicating that the sequencing circuit has received a first power voltage, the sequencing circuit provides a second power voltage to the element electrically coupled to the sequencing circuit. The sequencing circuit may implement current limiting to conserve space on the circuit board.

The circuit board of the present invention is utilized in a computer system including a memory, the circuit board, and a second circuit board. The second circuit board may be a midplane, backplane or motherboard. The second circuit board provides the multiple power voltages to the circuit board.

The invention also includes a method for supplying multiple power voltages to the circuit board from the second circuit board in a predictable sequence.

In a preferred embodiment, the circuit board of the present invention includes a clamping circuit and a discharge circuit. The clamping circuit includes multiple sequentially coupled diodes to limit a voltage difference between the first power voltage and the second power voltage provided by the sequencing circuit to the element, for example when the motherboard or backplane does not provide one of the first power voltage and the second power voltage to the sequencing circuit. The discharge circuit includes a diode to limit a voltage difference between the first power voltage and the second power voltage when one or both of the first power voltage and the second power voltage are interrupted briefly or for a long time. For example, one or both of the first power voltage and the second power voltage may become interrupted briefly during contact bounce, and may become interrupted for a long time when the circuit board is removed from the second circuit board providing the multiple power voltages.

Another embodiment solving the power sequencing problem includes a design limiting current by means of a transistor and a current sensing circuit. This compact power sequencing solution implements any necessary current limits in addition to power sequencing.

The sequencing circuit is compact, and does not consume much real estate on the circuit board. The invention is cost efficient and and can be implemented as a step in the board fabrication process.

DETAILED DESCRIPTION

This invention is described in a preferred embodiment in the following description with reference to the Figures, in which like numbers represent the same or similar elements. While this invention is described in terms of the best mode for achieving this invention's objectives, it will be appreciated by those skilled in the art that variations may be accomplished in view of those teachings without deviating from the spirit or scope of the invention.

Figure 1:
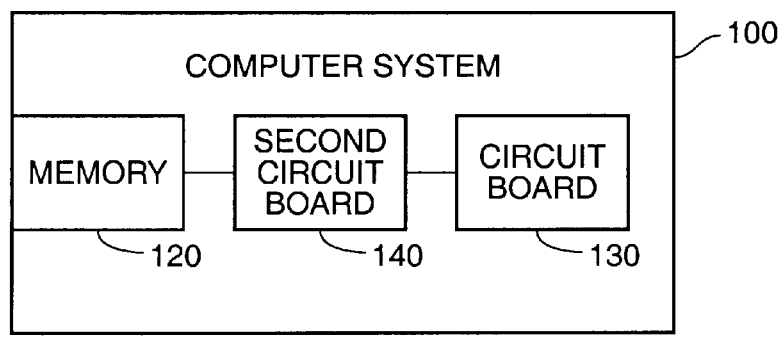
FIG. 1 is a block diagram of a computer system including a circuit board according to the present invention.

FIG. 1 shows a computer system 100. The computer system 100 includes a memory 120, a circuit board 130, and a second circuit board 140. The second circuit board 140 may be a midplane or backplane such as a motherboard, and is electrically coupled to the memory 120. The circuit board 130 may be an expansion card or peripheral card inserted into the second circuit board 140. The second circuit board 140 provides power to the circuit board 130. The provided power includes multiple power voltages. Common power voltages include +5 volts, and +3.3 volts. Power is generated external to the circuit board 130.

Figure 2:
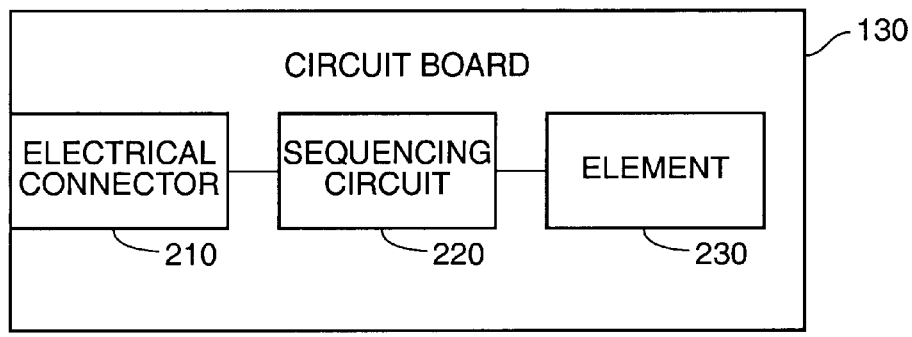
FIG. 2 is a block diagram of the circuit board shown in FIG. 1 including a sequencing circuit.

FIG. 2 shows the circuit board 130. The circuit board 130 includes an electrical connector 210, a sequencing circuit 220, and an element 230. The sequencing circuit 220 is electrically coupled to the electrical connector 210. The element 230 is electrically coupled to the sequencing circuit 220. The electrical connector 210 is electrically coupled to the second circuit board 140 and receives the multiple power voltages from the second circuit board 140. The electrical connector 210 may include one pin or multiple pins for each of one or more of the multiple power voltages. The pins of electrical connector 210 may vary in length. The pins may be located on the second circuit board 140, and the corresponding sockets located on the circuit board 130, or the pins may be located on the circuit board 130 and the corresponding sockets located on the second circuit board 140. When the circuit board 130 is inserted into the second circuit board 140, longer pins of the electrical connector 210 would tend to electrically couple with the second circuit board 140 before shorter pins electrically coupled with the second circuit board 140. Similarly, when the circuit board 130 is removed from the second circuit board 140, longer pins of the electrical connector 210 would tend to electrically uncouple from the second circuit board 140 after shorter pins electrically uncoupled with the second circuit board 140. The sequencing circuit 220 supplies to the element 230 the multiple power voltages in a predictable sequence, and maintains a relatively fixed voltage relationship between the voltages in the absence of any one of the voltages, as discussed below with the description of the clamping circuit 330 and the discharge circuit 340. The element 230 receives in the predictable sequence the multiple power voltages. The element 230 may be one or more chips, discrete components, and/or other electrical elements located on the circuit board 130. Although the present invention is particularly applicable to providing multiple power voltages in a predictable sequence to elements requiring the predictable sequence, it is understood that other elements on the circuit board 130 may not have this limitation. The element 230 may include parts that do require and/or do not require the multiple power voltages in the predictable sequence.

In still other embodiments, other combinations of power voltages are generated, provided, and/or supplied, and/or in different sequences.

Figure 3A:
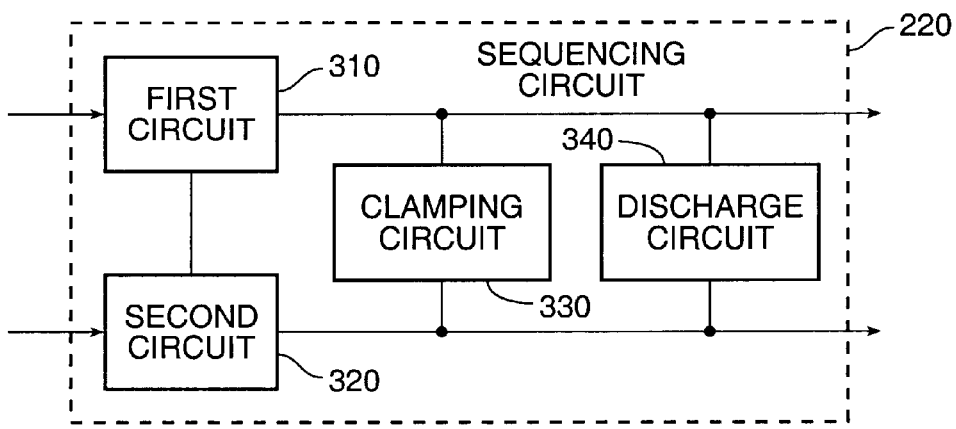
FIG. 3A is a block diagram of the sequencing circuit shown in FIG. 2 including a first circuit and a second circuit.

FIG. 3A shows the sequencing circuit 220. The sequencing circuit 220 includes a first circuit 310, a second circuit 320, a clamping circuit 330, and a discharge circuit 340. The second circuit 320 is electrically coupled to the first circuit 310. The clamping circuit 330 and the discharge circuit 340 are electrically coupled to the first circuit 310 and the second circuit 320. The first circuit 310 receives a first power voltage from the electrical connector 210 and supplies the first power voltage to the element 230. In this embodiment, the second circuit 320 waits to receive the first power voltage from the electrical connector 210 indirectly, through the first circuit 310. The first circuit 310 enables the second circuit 320. The second circuit 320 receives the second power voltage from the electrical connector 210. Responsive to receiving the first power voltage, the second circuit 320 supplies the second power voltage to the element 230.

The clamping circuit 330 includes a plurality of sequentially coupled diodes. The sequentially coupled diodes limit a voltage difference between the first power voltage supplied to the element 230 and the second power voltage supplied to the element 230. In one embodiment, three sequentially coupled diodes, each with a 0.6 volt forward voltage, ensure that the voltage difference between a +5 volt plane and a +3.3 volt plane does not exceed 1.8 volts. Other embodiments may include a different number of diodes and/or different forward voltages.

The discharge circuit 340 includes a diode. The diode addresses the situation of contact bounce, where a power voltage may suddenly be interrupted. In one embodiment where the diode electrically couples the +3.3 volt plane and the +5 volt plane, if power to the +5 volt plane should be lost, the diode pulls the voltage of the +3.3 volt plane to within a diode voltage drop of the +5 volt plane.

The clamping circuit 330 and the discharge circuit 340 also prevent damage to the circuit board 130 when the circuit board 130 is removed from the second circuit board 140, and in cases of contact bounce. Removing the circuit board 130 interrupts the provided multiple power voltages in an unpredictable sequence due to skew of the connectors of the circuit board 130 relative to the second circuit board 140 during removal.

In alternative embodiments, more than two power voltages are supplied from the sequencing circuit 220 to the element 230. The sequencing circuit 220 supplying more than two power voltages to the element 230 may include multiple cascaded circuits to ensure that the multiple power voltages are supplied to the element 230 in a predictable sequence.

In further embodiments, the first power voltage may be supplied directly to the second circuit 320 from the electrical connector 210, or indirectly through another circuit.

In other embodiments, the second circuit 320 does not receive the first power voltage but instead another signal indicating that the sequencing circuit 220 has received the first power voltage. Responsive to receiving the signal, the second circuit 320 supplies the second power voltage to the element 230.

Figure 3B:
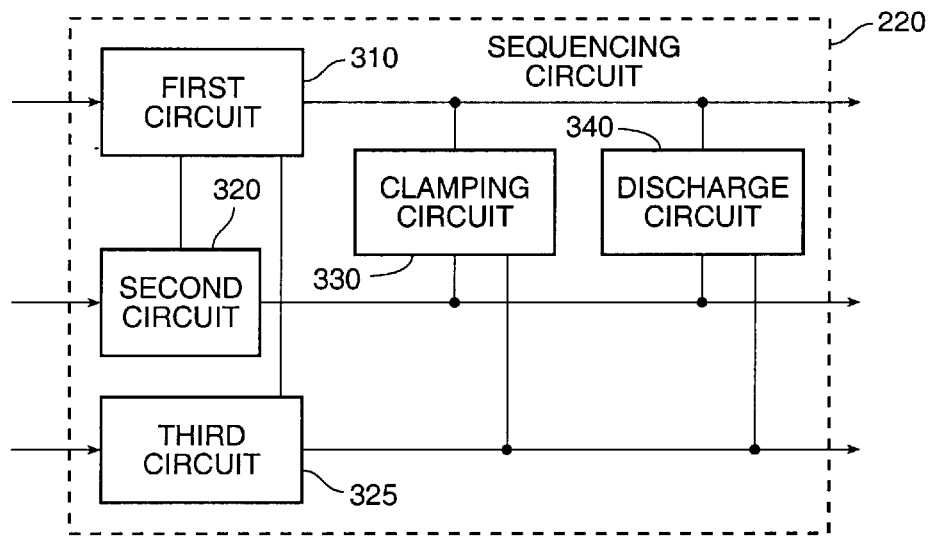
FIG. 3B is an alternative block diagram of the sequencing circuit shown in FIG. 2 including a first circuit, a second circuit, and a third circuit.

FIG. 3B shows another sequencing circuit 220, similar to the sequencing circuit 220, but further including a third circuit 325. The third circuit 325 is electrically coupled to the first circuit 310, the clamping circuit 330, and the discharge circuit 340. The third circuit 325 functions in a manner substantially similar to the second circuit 320. However, responsive to receiving a signal indicating that the sequencing circuit 220 is receiving the first power voltage, the third circuit 325 may either send the first power voltage to the element 230, or send the second power voltage to the element 230, depending on the voltage input to the third circuit 325.

Alternatively, the third circuit 325 receives a third power voltage generated externally from the circuit board 130. Responsive to receiving a signal indicating that the sequencing circuit 220 is receiving at least one of the first power voltage and the second power voltage, the third circuit 325 supplies the third voltage to the element 230.

Figure 4:
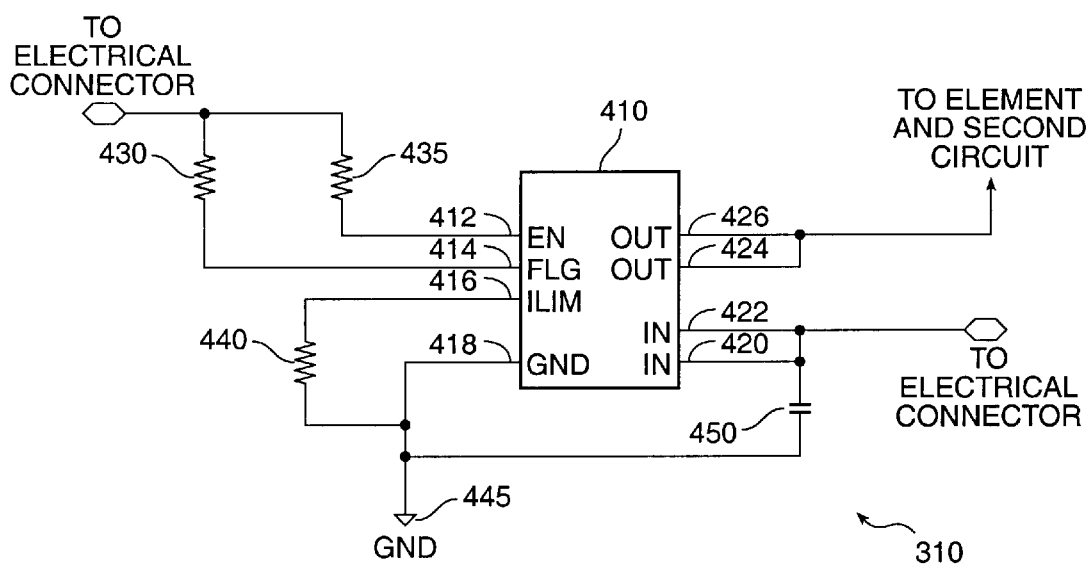
FIG. 4 is a circuit diagram of the first circuit shown in FIGS. 3A and 3B.

FIG. 4 shows the first circuit 310. The first circuit 310 includes a Micrel 2545 chip 410, which may alternatively be a Micrel 2549, Micrel 2545A, or Micrel 2549A chip 410. The Micrel 2545A and Micrel 2549A chips demonstrate improved process control and reliability over the Micrel 2545 and Micrel 2549 chips. These various Micrel components provide power switching, current limiting, and short-circuit thermal shutdown functions. An enable pin on these components powers the components on and off, under control of other circuitry. There are resistors 430, 435, 440, and a capacitor 450. The chip 410 includes the following pins: EN 412, FLG 414, ILIM 416, GND 418, IN 420, IN 422, OUT 424, and OUT 426. The resistor 435 electrically couples the pin 412 to the electrical connector 210 to receive the first power voltage, +5 volts in this embodiment. The resistor 430 electrically couples the pin 414 to the electrical connector 210 to receive the first power voltage. The resistor 440 electrically couples the pin 416 to the pin 418, and is electrically coupled to a ground 445. The pin 418 is electrically coupled to a ground 445. The capacitor 450 electrically couples the ground 445 to the pins 420 and 422. The pins 420 and 422 are electrically coupled to the electrical connector 210 to receive the first power voltage. The pins 424 and 426 are electrically coupled to a +5 volt plane, which in turn is electrically coupled to the element 230 and the second circuit 320. A signal is also sent to the second circuit 320, as will be described below in greater detail in connection with FIG. 5A.

When the first power voltage is provided from the second circuit board 140 to the circuit board 130, the chip 410 is enabled and provides a current limited first power voltage to the +5 volt plane. This embodiment provides a compact and inexpensive solution taking advantage of monolithic parts that accomplish both power sequencing and current limiting, conserving limited area on the circuit board 130. The total time elapsed from the moment the second circuit board 140 provides the first power voltage and the second power voltage to the moment the sequencing circuit 220 supplies the first power voltage and the second power voltage is less than 4 milliseconds.

Figure 5A:
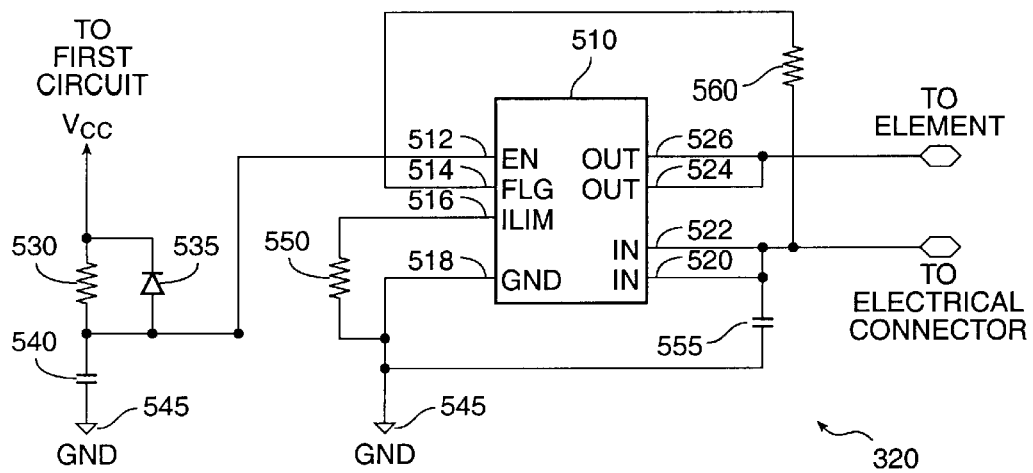
FIG. 5A is a circuit diagram of the second circuit shown in FIG. 3A and 3B.

FIG. 5A show the second circuit 320. The second circuit 320 includes a Micrel 2545 chip 510, a resistor 530, a diode 535, a capacitor 540, a resistor 550, a capacitor 555, and a resistor 560. The chip 510 includes the following pins: EN 512, FLG 514, ILIM 516, GND 518, IN 520, IN 522, OUT 524, and OUT 526. The resistor 530 and the diode 535 are in parallel with each other, and electrically couple the pin 512 to the +5 volt plane powered from the first circuit 310. An anode of the diode 535 faces toward the pin 512. The capacitor 540 electrically couples the pin 512 to a ground 545. The resistor 560 electrically couples the pin 514 to the pins 520 and 522. The resistor 550 electrically couples the pin 516 to the pin 518, and is electrically coupled to the ground 545. The pin 518 is electrically coupled to the ground 545. The capacitor 555 electrically couples the pins 520 and 522 to the ground 545. The pins 520 and 522 are electrically coupled to the electrical connector 210. The pins 524 and 526 are electrically coupled to a +3.3 volt plane. As described in connection with FIG. 4, a signal may have been received from the first circuit 310. Only after the first power voltage is received by the second circuit 320, the chip 510 is enabled and provides a current limited second power voltage to the +3.3 volt plane. The +3.3 volt plane in turn is electrically coupled to the element 230.

In another embodiment, the second circuit 320 supplies the second power voltage responsive to a signal indicating that the sequencing circuit 220 received the first power voltage.

Figure 5B:
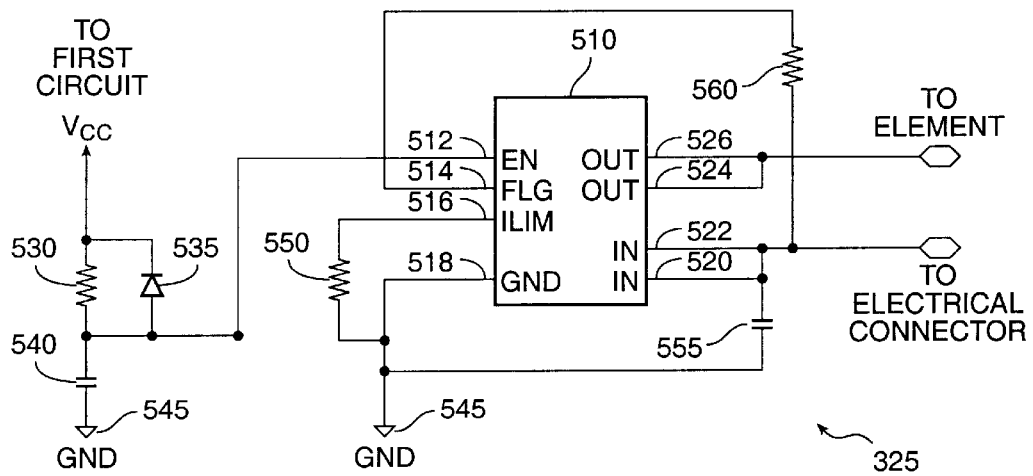
FIG. 5B is a circuit diagram of the third circuit shown in FIG. 3B.

FIG. 5B shows the third circuit 325. The third circuit 325 operates in a manner substantially similar to the second circuit 320. However, the third circuit may receive either the first power voltage or the second power voltage in pins 520 and 522, and in turn provide the element 230 with either the first power voltage or the second power voltage.

Figure 6:
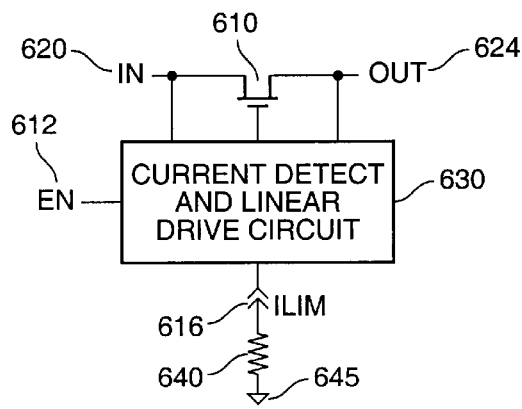
FIG. 6 is a circuit diagram describing an alternative implementation replacing the power switching parts shown in FIGS. 4 and 5.

Further embodiments use other monolithic chips including other power switching circuits. Other embodiments use discrete components including discrete transistors. FIG. 6 shows a circuit 600 describing an alternative implementation replacing the Micrel 2545 chips 410 and 510 shown in FIGS. 4 and 5. Circuit 600 includes a transistor 610, a current detect and linear drive circuit 630 for the transistor 610, and resistor 640. A terminal IN 620 is electrically coupled to a first terminal of the transistor 610 and the current detect and linear drive circuit 630. A terminal OUT 624 is electrically coupled to a second terminal of the transistor 610 and the current detect and linear drive circuit 630. A gate of the transistor 610 is electrically coupled to the current detect and linear drive circuit 630. A terminal EN 612 enables the current detect and linear drive circuit 630. The current detect and linear drive circuit 630 is electrically coupled to a ground 645 through a terminal ILIM 616 and the resistor 640. The resistor 640 controls a current limit for the transistor 610.

In other embodiments, the predictable sequence includes other multiple voltages and/or in a different sequence. The supplied voltages include increasing and decreasing sequences, but do not have to follow an increasing or decreasing sequence, for example −12 volts followed by +5 volts followed by +3.3 volts.

In an alternative embodiment, a third power voltage is provided by the second circuit board 140 and received by the electrical connector 210 of the circuit board 130. The third circuit 425 may be coupled to one or both of the first circuit 310 and the second circuit 320. The third circuit 325 receives the third power voltage from the electrical connector 210 and, responsive to receiving a signal from the first circuit 310 or the second circuit 320, provides the third power voltage to the element 230.

The computer system 100 follows the Compact PCI Hot Swap specification. Other embodiments follow the Hot-Plug specification, and/or other specifications relating to the ability to remove devices from and add devices to a computer while the computer is running.

Other embodiments include locating sequencing circuitry on the second circuit board 140 of the system, rather than the circuit board 130.

A method according to the present invention supplies in a predictable sequence a first power voltage and then a second power voltage provided from a second circuit board 140 to an element 230 of a circuit board 130. The first power voltage and the second power voltage are provided from the second circuit board 140 to a sequencing circuit 220 of the circuit board 130. The first power voltage is supplied to an element 230 of the circuit board 130. Responsive to the sequencing circuit 220 receiving the first power voltage, the second power voltage is supplied to the element 230 of the circuit board 130.

While the preferred embodiments of the present invention have been illustrated herein in detail, it should be apparent that modifications and adaptations to those embodiments may occur to those skilled in the art without departing from the scope of the present invention as set forth in the following claims.

We claim:

1. A circuit board adapted to receive at least a first power voltage and a second power voltage and having circuitry for supplying to an element of the circuit board in a predictable sequence the first power voltage and then the second power voltage, comprising:

an electrical connector for receiving the first power voltage and the second power voltage, wherein the first power voltage and the second power voltage are generated externally from the circuit board;

a sequencing circuit electrically coupled to the electrical connector, wherein the electrical connector is adapted to supply the first power voltage and thereafter supply the second power voltage to the sequencing circuit, the sequencing circuit comprising:

a first circuit for receiving the first power voltage and supplying the first power voltage to the element of the circuit board; and a second circuit electrically coupled to the first circuit, and the second circuit for supplying the second power voltage to the element of the circuit board, responsive to receiving a signal indicating that the sequencing circuit is receiving the first power voltage, wherein the element of the circuit board is electrically coupled to the sequencing circuit and is adapted to receive the first power voltage and the second power voltage in sequence.

2. The circuit board of claim 1, further comprising:

a clamping circuit electrically coupled to the first circuit and the second circuit, wherein the clamping circuit limits a voltage difference between the first power voltage supplied to the element of the circuit board and the second power voltage supplied to the element of the circuit board.

3. The circuit board of claim 2, wherein the clamping circuit includes one or more sequentially coupled diodes.

4. The circuit board of claim 1, further comprising:

current limiting circuitry electrically coupled to the first circuit and the second circuit, the current limiting circuitry for current limiting the first power voltage supplied to the element of the circuit board and the second power voltage supplied to the element of the circuit board.

5. The circuit board of claim 1, further comprising:

a discharge circuit electrically coupling the first circuit and the second circuit for limiting a voltage difference between the first power voltage supplied to the element of the circuit board and the second power voltage supplied to the element of the circuit board when the electrical connector no longer receives at least one of the first power voltage and the second power voltage generated externally from the circuit board.

6. The circuit board of claim 1, wherein the first circuit and the second circuit include power switching circuits.

7. The circuit board of claim 1, wherein the signal received by the second circuit from the first circuit is the first power voltage.

8. The circuit board of claim 1, wherein the first power voltage is supplied to the element of the second circuit board through the first circuit.

9. The circuit board of claim 1, further comprising:

a third circuit electrically coupled to the electrical connector and at least one of the first circuit and the second circuit, and the third circuit for supplying one of the first voltage and the second voltage to the element of the circuit board, responsive to receiving a signal indicating that the sequencing circuit is receiving the first power voltage.

10. The circuit board of claim 1, wherein the electrical connector receives a third power voltage generated externally from the circuit board, the circuit board further comprising:

a third circuit electrically coupled to the electrical connector and at least one of the first circuit and the second circuit, the third circuit for supplying the third voltage to the element of the circuit board, responsive to receiving a signal indicating that the sequencing circuit is receiving at least one of the first power voltage and the second power voltage.

11. The circuit board of claim 1, further comprising:

a clamping circuit electrically coupled to the first circuit and the second circuit; and a discharge circuit electrically coupled to the first circuit and the second circuit, the discharge circuit limiting a voltage difference between the first power voltage supplied to the element of the circuit board and the second power voltage supplied to the element of the circuit board when the electrical connector no longer receives at least one of the first power voltage and the second power voltage generated externally from the circuit board;

wherein the clamping circuit limits a voltage difference between the first power voltage supplied to the element of the circuit board and the second power voltage supplied to the element of the circuit board; and wherein the clamping circuit and the discharge circuit are electrically coupled to the first and second circuits in parallel and electrically coupled to each other in sequence.

12. The circuit board of claim 11, wherein the first and second circuits comprise respective first and second microchips;

wherein the first microchip comprises a first input, a second input, a first output, and a second output, the first input receiving a second signal from the electrical connector, the second input receiving the first power voltage from the electrical connector, the first output supplying the first power voltage to the element based on the received second signal, and the second output supplying the signal indicating that the sequencing circuit is receiving the first power voltage; and wherein the second microchip comprises a third input, a fourth input, a third output, and a fourth output, the third input receiving the signal from the second output, the fourth input receiving the second power voltage from the electrical connector, the third output supplying the second power voltage to the element based on the received signal, and the fourth output supplying a third signal.

13. The circuit board of claim 1, wherein the first and second circuits comprise respective first and second microchips;

wherein the first microchip comprises a first input, a second input, a first output, and a second output, the first input receiving a second signal from the electrical connector, the second input receiving the first power voltage from the electrical connector, the first output supplying the first power voltage to the element based on the received second signal, and the second output supplying the signal indicating that the sequencing circuit is receiving the first power voltage; and wherein the second microchip comprises a third input, a fourth input, a third output, and a fourth output, the third input receiving the signal from the second output, the fourth input receiving the second power voltage from the electrical connector, the third output supplying the second power voltage to the element based on the received signal, and the fourth output supplying a third signal.

14. The circuit board of claim 13, wherein the third input is connected with the second output via a resistor and a diode;

wherein the resistor and the diode are connected to the third input and the second output in parallel; and wherein the diode comprises an anode electrically coupled to the third input.

15. The circuit board of claim 1, wherein the first circuit is connected to the second circuit via a resistor and a diode;

wherein the resistor and the diode are connected to the first and the second circuits in parallel; and wherein the diode comprises an anode electrically coupled to the second circuit.

16. A method for supplying to one or more elements of a circuit board in a predictable sequence at least a first power voltage and then a second power voltage provided from a second circuit board, comprising:

sequentially providing the first power voltage and the second power voltage from the second circuit board to a sequencing circuit of the circuit board;

responsive to the sequencing circuit receiving the first voltage, supplying the first power voltage to an element of the circuit board via a first circuit of the sequencing circuit;

responsive to the sequencing circuit receiving the first voltage, supplying a signal to a second circuit of the sequencing circuit from the first circuit of the sequencing circuit; and responsive to the second circuit of the sequencing circuit receiving the signal, supplying the second power voltage to the element of the circuit board via the second circuit of the sequencing circuit.

17. The method of claim 16, further comprising:

limiting a voltage difference between the first power voltage supplied to the element of the circuit board and the second power voltage supplied to the element of the circuit board, when the second circuit board no longer provides to the circuit board at least one of the first power voltage and the second power voltage.

18. The method of claim 16, further comprising:

limiting a voltage difference between the first power voltage supplied to the element of the circuit board and the second power voltage supplied to the element of the circuit board, when the second circuit board provides to the circuit board the first power voltage and the second power voltage.

19. The method of claim 16, wherein the first power voltage supplied to the element of the circuit board and the second power voltage supplied to the element of the circuit board are current limited.

20. The method of claim 16, further comprising:

preventing damage to the circuit board when the circuit board is removed from the second circuit board and the removal interrupts in an unpredictable sequence the first power voltage and the second power voltage provided from the second circuit board.

21. The method of claim 16, wherein the first power voltage is higher than the second power voltage.

22. The method of claim 21, wherein the first power voltage is 5 V and the second power voltage is 3.3 V.

23. The method of claim 16, wherein the second power voltage is greater than the first power voltage.

24. The method of claim 16, wherein the predictable sequence follows a hot swapping specification.

25. The method of claim 24, wherein the hot swapping specification is the Compact PCI Hot Swap specification.

26. The method of claim 24, wherein the hot swapping specification is the PCI Hot-Plug specification.

27. A computer system, comprising:

a memory;

a circuit board electrically coupled to the memory, and the circuit board adapted to supply to an element of the circuit board in a predictable sequence at least the first power voltage and the second power voltage, comprising:

an electrical connector for receiving a first power voltage and a second power voltage;

a sequencing circuit electrically coupled to the electrical connector, wherein the electrical connector is adapted to supply the first power voltage before supplying the second power voltage to the sequencing circuit, the sequencing circuit comprising:

a first circuit for receiving the first power voltage and supplying the first power voltage to the element of the circuit board; and a second circuit electrically coupled to the first circuit, and the second circuit for supplying the second power voltage to the element of the circuit board responsive to the sequencing circuit receiving the first power voltage; and the element of the circuit board, the element electrically coupled to the sequencing circuit, and the element adapted to receive in the predictable sequence the first power voltage and then the second power voltage; and a second circuit board electrically coupled to the circuit board, and the second circuit board providing the first power voltage and the second power voltage to the electrical connector of the circuit board.

* * * * *